United States Patent
Jawarani et al.

(10) Patent No.: US 8,247,850 B2
(45) Date of Patent: Aug. 21, 2012

(54) DUAL INTERLAYER DIELECTRIC STRESSOR INTEGRATION WITH A SACRIFICIAL UNDERLAYER FILM STACK

(75) Inventors: Dharmesh Jawarani, Round Rock, TX (US); Ross E. Noble, Austin, TX (US); David C. Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 632 days.

(21) Appl. No.: 11/650,252

(22) Filed: Jan. 4, 2007

(65) Prior Publication Data
US 2008/0164531 A1  Jul. 10, 2008

(51) Int. Cl.
 *H01L 29/76* (2006.01)
(52) U.S. Cl. ......... 257/288; 257/E21.632; 257/E27.108; 438/199; 438/288
(58) Field of Classification Search .................. 257/288, 257/E27.108; 438/199
See application file for complete search history.

(56) References Cited

U.S. PATENT DOCUMENTS

| | | | |
|---|---|---|---|
| 7,262,472 B2 * | 8/2007 | Pidin | 257/410 |
| 7,432,147 B2 * | 10/2008 | Akasaka | 438/216 |
| 2003/0181005 A1 * | 9/2003 | Hachimine et al. | 438/231 |
| 2005/0093030 A1 | 5/2005 | Doris et al. | |
| 2005/0158970 A1 * | 7/2005 | Chau et al. | 438/479 |
| 2005/0263825 A1 * | 12/2005 | Frohberg et al. | 257/369 |
| 2006/0091471 A1 | 5/2006 | Frohberg et al. | |
| 2006/0228848 A1 * | 10/2006 | Chan et al. | 438/199 |
| 2007/0004199 A1 * | 1/2007 | Ireland et al. | 438/672 |
| 2007/0111452 A1 * | 5/2007 | Chou et al. | 438/275 |
| 2007/0249113 A1 * | 10/2007 | Grudowski et al. | 438/199 |
| 2008/0073724 A1 * | 3/2008 | Liang et al. | 257/369 |

FOREIGN PATENT DOCUMENTS

WO  WO 2004/049406 A1  6/2004

OTHER PUBLICATIONS

Wolf, S. Silicon Processing for the VLSI Era, 1986 Lattice Press vol. 1.*
H.S. Yang et al., "Dual Stress Liner for High Performance sub-45nm Gate Length SOI CMOS Manufacturing"; EIDM 2004 Late News; 2004 IEEE, 3 pages.
Pidin, S. et al.: "A Novel Strain Enhanced CMOS Architecture Using Selectively Deposited High Tensile and High Compressive Silicon Nitride Films"; IEEE 2004; 4 pages.

* cited by examiner

*Primary Examiner* — Thao Le
*Assistant Examiner* — Matthew Gordon
(74) *Attorney, Agent, or Firm* — Jackson Walker L.L.P.

(57) ABSTRACT

A method for making a semiconductor device is provided by (a) providing a substrate (203) having first (205) and second (207) gate structures thereon; (b) forming an underlayer (231) over the first and second gate structures; (c) removing the underlayer from the first gate structure; (d) forming a first stressor layer (216) over the first and second gate structures; and (e) selectively removing the first stressor layer from the second gate structure through the use of a first etch which is selective to the underlayer.

20 Claims, 6 Drawing Sheets

DUAL INTERLAYER DIELECTRIC STRESSOR INTEGRATION WITH A SACRIFICIAL UNDERLAYER FILM STACK

FIELD OF THE DISCLOSURE

The present disclosure relates generally to semiconductor devices, and more particularly to methods for making semiconductor devices having dual etch stop layer (ESL) stressor structures.

BACKGROUND OF THE DISCLOSURE

The use of a thin layer of strained silicon in the channel layer of CMOS devices has been found to improve the performance characteristics of these devices. The presence of strain in the channel layer causes the individual silicon atoms within that layer to be forced farther apart or closer together in their lattice structure than would be the case in the unstrained material. The larger or smaller lattice spacing results in a change in the electronic band structure of the device such that current carriers (i.e., electrons and holes) have higher mobilities within the channel layer, thereby resulting in higher currents in the transistor and faster circuit speeds.

In CMOS devices, strained channel layers may be achieved by imparting local mechanical stresses to the device. Electron mobility, and therefore NMOS performance, may be improved by imparting tensile stress along (i.e., parallel to) the direction of current flow or orthogonal to the direction of current flow. Hole mobility, and therefore PMOS performance, may be enhanced by imparting compressive stress parallel to the direction of current flow, and by imparting tensile stress perpendicular to the direction of current flow.

Contact etch stop layer (ESL) films may be utilized to impart local mechanical stresses, and in particular, tensile or compressive stresses, to the channel layer of an NMOS or PMOS device. Thus, tensile stress may be imparted to an NMOS channel by applying a tensile etch stop film, and compressive stress may be imparted to a PMOS channel by applying a compressive etch stop film. However, in order to maximize CMOS performance, it is desirable to avoid applying either a compressive film or a tensile film to both regions of a CMOS transistor, since compressive films can degrade NMOS performance, while tensile films can degrade PMOS performance. Consequently, methods have been developed in the art to selectively apply tensile films and compressive films to only the NMOS and PMOS regions of a CMOS transistor, respectively.

DETAILED DESCRIPTION

In one aspect, a method for making a semiconductor device is provided for (a) providing a substrate having first and second gate structures thereon; (b) forming an underlayer over the first and second gate structures; (c) removing the underlayer from the first gate structure; (d) forming a first stressor layer over the first and second gate structures; and (e) selectively removing the first stressor layer from the second gate structure through the use of a first etch which uses the underlayer as an etch stop layer.

In another aspect, a method for making a semiconductor device is provided for (a) providing a substrate having first and second gate structures thereon, wherein the first gate structure is disposed in an NMOS region of the device, and wherein the second gate structure is disposed in a PMOS region of the device; (b) forming an underlayer over the substrate; (c) forming a first layer of stress inducing material over the underlayer; (d) masking the device such that the first gate structure is exposed and the second gate structure is covered; and (e) removing the first layer of stress inducing material from the first gate structure with a first wet etch which is selective to the underlayer.

In a further aspect, a semiconductor device is provided having (a) a substrate having first and second gate structures thereon, wherein the first gate structure is disposed in an NMOS region of the device, and wherein the second gate structure is disposed in a PMOS region of the device; (b) an underlayer disposed over the substrate; and (c) a first layer of stress inducing material disposed over the underlayer.

The methodologies disclosed herein may be appreciated in the context of the prior art process depicted in FIGS. 1-9. The process depicted therein is a known process for making a MOSFET device with a dual etch stop layer (ESL) stressor integration. In this process, tensile films and compressive films are selectively applied to the NMOS and PMOS regions, respectively, of a CMOS transistor. It is to be noted that the structures depicted in these figures (as well as in subsequent FIGS. 10-20) have been simplified for ease and clarity of illustration. Thus, for example, although not shown in the figures, it will be appreciated that the NMOS and PMOS regions in a semiconductor device will typically be isolated from each other by way of one or more trench isolation structures.

Figure 1:
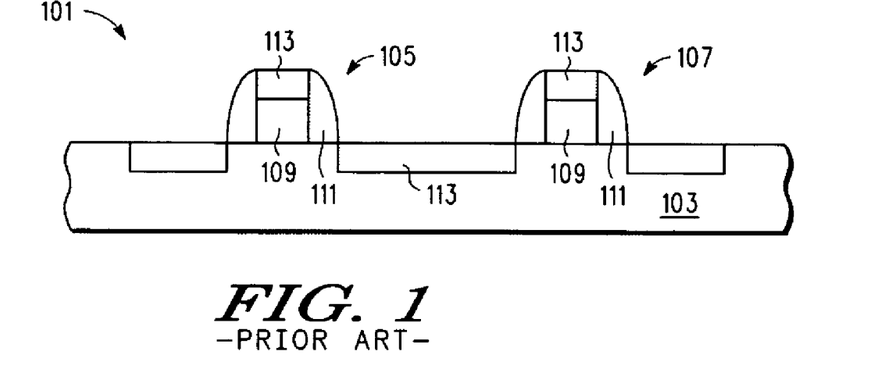
FIG. 1 illustrates a step in a prior art process for making a dual stressor structure.

As shown in FIG. 1, a structure 101 is provided which comprises a substrate 103 upon which are defined first 105 and second 107 gate structures corresponding, respectively, to the PMOS and NMOS regions of a CMOS device. Each of the gate structures 105, 107 comprises a gate electrode 109 and adjacent spacer structures 111. A layer of silicide 113 is present on the gate electrodes 109 and the portions of the substrate 103 adjacent thereto.

Figure 2:
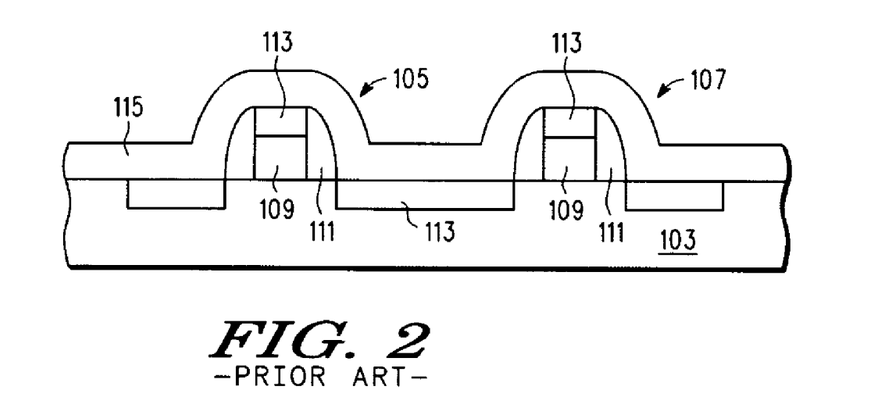
FIG. 2 illustrates a step in a prior art process for making a dual stressor structure.

Referring now to FIG. 2, a tensile stressor layer 115 is deposited over the structure. The tensile stressor layer 115 is preferably deposited as a conformal layer.

Figure 3:
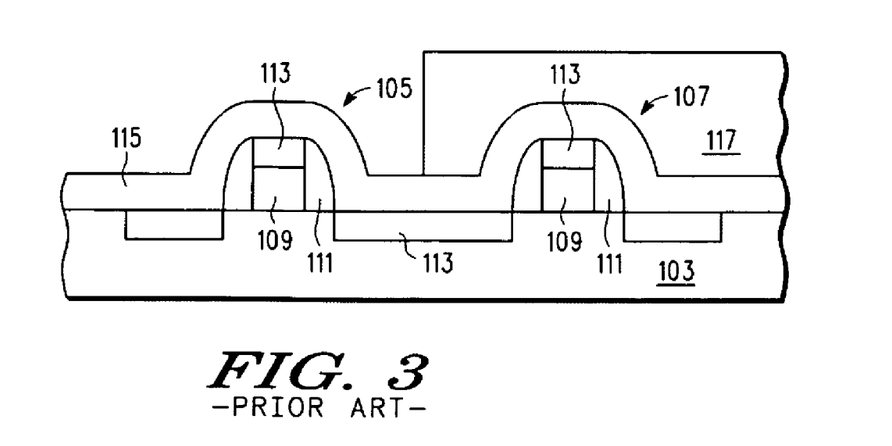
FIG. 3 illustrates a step in a prior art process for making a dual stressor structure.
Figure 4:
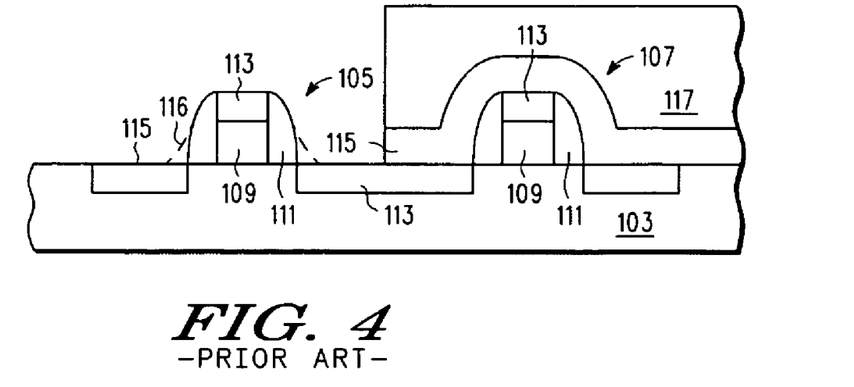
FIG. 4 illustrates a step in a prior art process for making a dual stressor structure.
Figure 5:
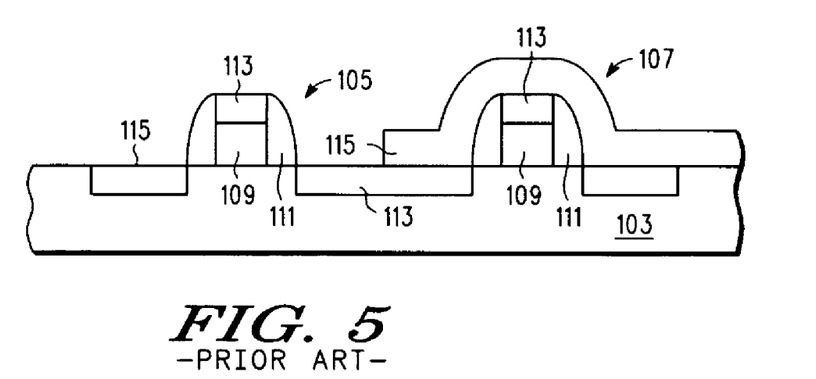
FIG. 5 illustrates a step in a prior art process for making a dual stressor structure.
Figure 6:
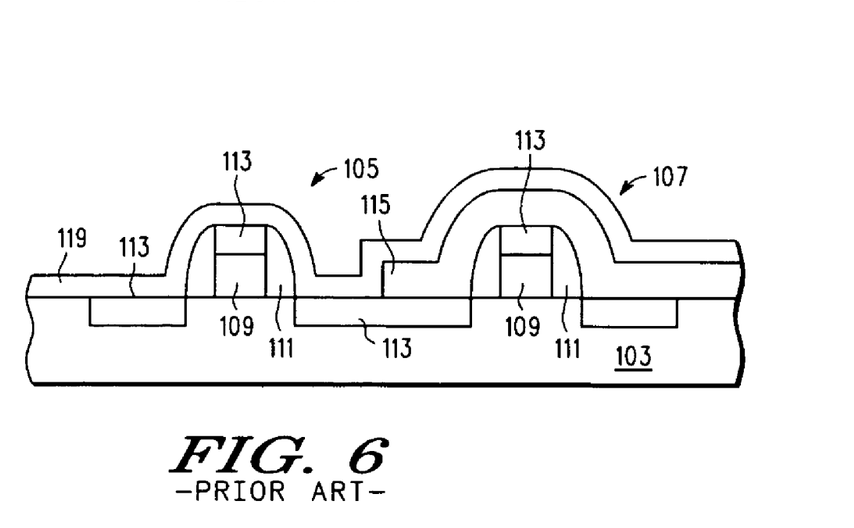
FIG. 6 illustrates a step in a prior art process for making a dual stressor structure.

As shown in FIG. 3, a first layer of photoresist 117 is then deposited over the structure and is patterned such that the region of the structure containing the first gate structure 105 is exposed, and the region of the structure containing the second gate structure 107 is masked. The exposed portion of the tensile stressor layer 115 is then removed from the device with a dry etch, as shown in FIG. 4. The first layer of photoresist 117 is then stripped as shown in FIG. 5, after which a conformal compressive stressor layer 119 is deposited over the structure, as shown in FIG. 6.

Figure 7:
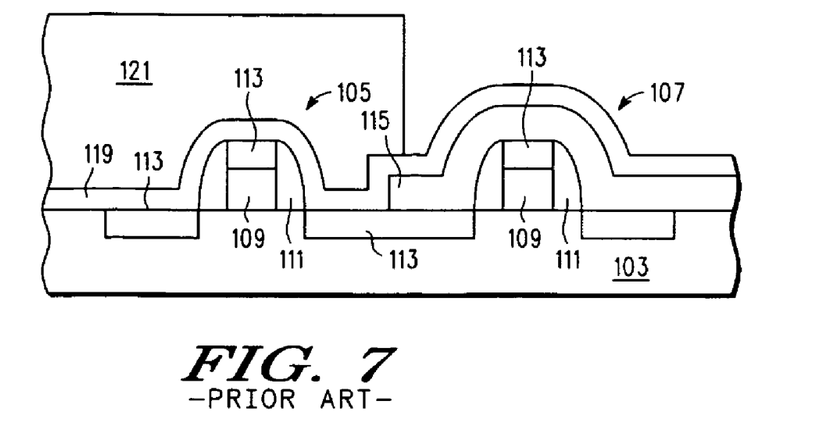
FIG. 7 illustrates a step in a prior art process for making a dual stressor structure.
Figure 8:
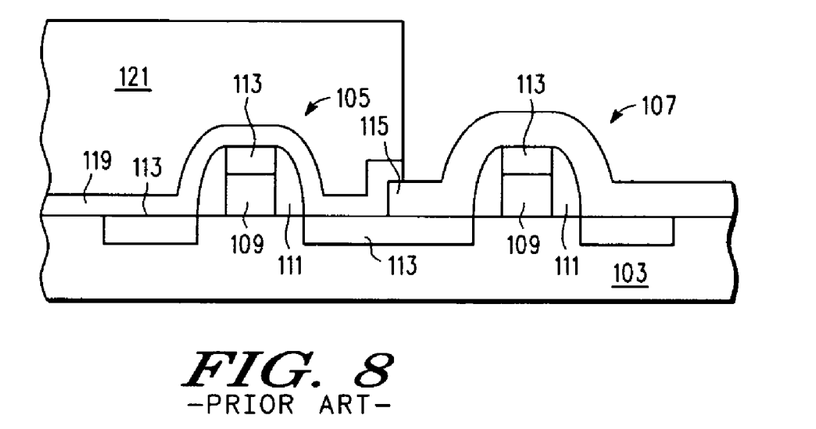
FIG. 8 illustrates a step in a prior art process for making a dual stressor structure.
Figure 9:
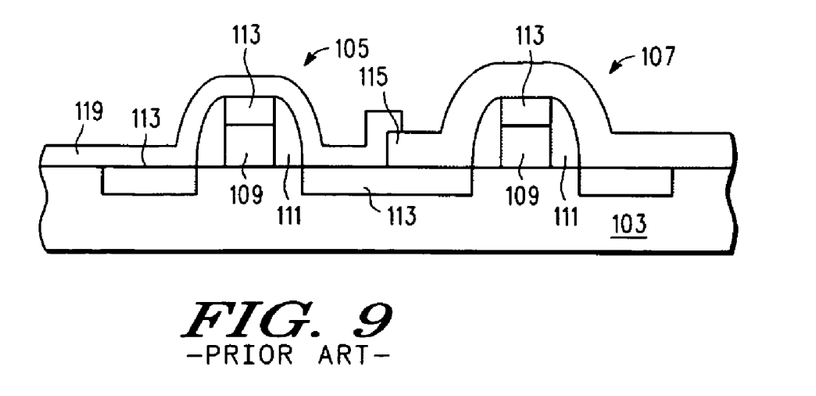
FIG. 9 illustrates a step in a prior art process for making a dual stressor structure.

Referring now to FIG. 7, a second layer of photoresist 121 is deposited over the structure and is patterned such that the region of the structure containing the second gate structure 107 is exposed, and the region of the structure containing the first gate structure 105 is masked. As shown in FIG. 8, the compressive stressor layer 119 is then removed from the exposed region with a suitable etchant. The second layer of photoresist 121 is then stripped to yield the structure shown in FIG. 9. The structure depicted therein has a compressive stressor layer 119 disposed over the first gate structure 105 of the device, and a tensile stressor layer 115 disposed over the second gate structure 107 of the device.

Despite the performance enhancements possible for CMOS transistors by selectively applying tensile films and compressive films, respectively, to only the NMOS and PMOS regions of these devices, in practice, the foregoing process suffers from some notable infirmities. In particular, this process relies on dry etching to remove the portion of the tensile stressor layer 115 which extends over the first gate structure 105 (see FIG. 4) in the PMOS region of the device. However, dry etching frequently leaves behind some residue 116 (see FIG. 4) of the stressor film adjacent to the spacer. As noted above, the presence of this material may prevent the achievement of optimal performance in the resulting device, since compressive films tend to degrade NMOS performance, while tensile films tend to degrade PMOS performance. However, such a result may be difficult to avoid with a dry etch that must typically also be selective to silicon, metal suicides (e.g., NiSi), and oxide liners. This problem may be exacerbated in disposable spacer integrations, due to the more severe profiles that may result.

While conventional wet etch processes (using an etchant such as aqueous HF) may be used instead to remove the tensile stressor layer 115 which extends over the first gate structure 105, conventional wet etches frequently result in gouging of the underlying metal silicide 113 (typically NiSi), and hence degrade the electrical properties of the device. This effect can be mitigated in some instances by using an oxide underlayer, but the use of oxide underlayers often leads to a drastic reduction in the performance enhancement obtained from dual ESL integrations.

There is thus a need in the art for a process for the selective removal of tensile stressor films from the PMOS regions of a CMOS device, and for the selective removal of compressive stressor films from the NMOS regions of a CMOS device. There is further a need in the art for such a process which does not leave a residue of these stressor films next to polysilicon lines. This need is particularly acute in integrations in which the use of disposable spacers leads to vertical profiles of the type which pose challenges to dry etching (that is, integrations in which residual stressor films can be expected to remain adjacent to silicon lines if a dry etch is used).

It has now been found that the aforementioned infirmities in the art may be addressed through the use of a (preferably isotropic) wet etch in conjunction with a sacrificial underlayer, such as a TiN film capped with an oxide hard mask film. The sacrificial underlayer acts as an etch stop for the wet and dry etch, thus allowing complete removal of the overlying stressor film from regions of the device in which its presence is not desired. During the wet etch, the sacrificial underlayer also protects the underlying features of the device from exposure to the etch and, in particular, protects the silicide regions of the device from gouging. The sacrificial underlayer film (or portions thereof) may be subsequently removed with a suitable wet or dry etch.

Figure 10:
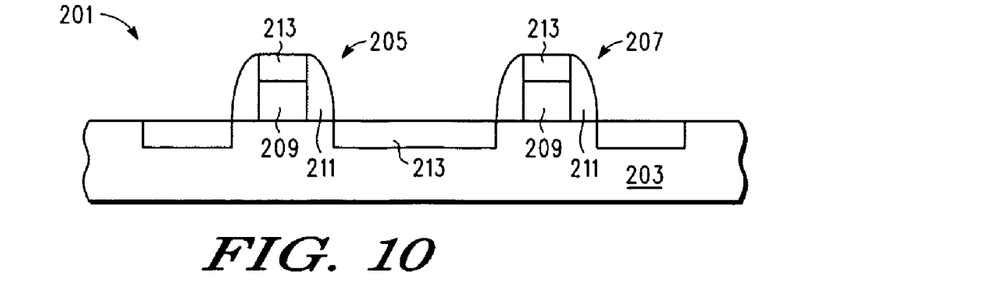
FIG. 10 illustrates a step in a process for making a dual stressor structure in accordance with the teachings herein.

A first particular, non-limiting embodiment of the methodology disclosed herein is depicted in FIGS. 10-21. With reference to FIG. 10, the process begins with a structure 201 which is similar to the structure depicted in FIG. 1. This structure 201 comprises a semiconductor substrate 203 upon which are defined first 205 and second 207 gate structures corresponding, respectively, to the PMOS and NMOS regions of a CMOS transistor. Each of the gate structures 205, 207 comprises a gate electrode 209 and adjacent spacer structures 211. A layer of metal silicide 213 is present on the gate electrodes 209 and on the portions of the substrate 203 adjacent thereto. While the substrate 203 has been depicted as a monolithic structure for simplicity of illustration, it will be appreciated that the substrate may comprise various layers or structures as are known to the art, including trench isolation structures and source/drain regions, and may include bulk or SOI wafers.

Figure 11:
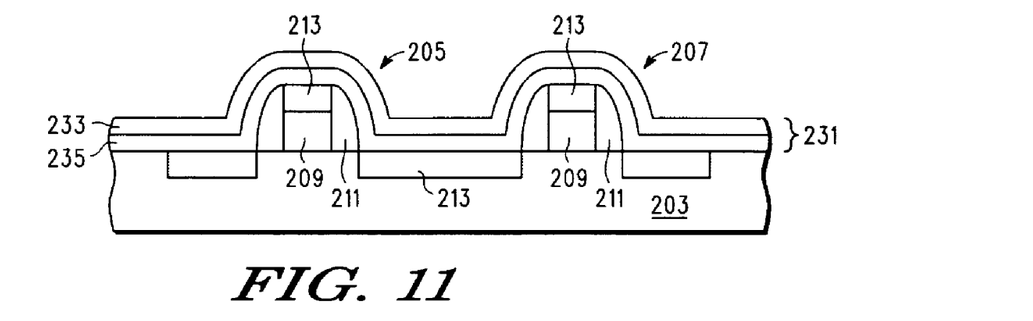
FIG. 11 illustrates a step in a process for making a dual stressor structure in accordance with the teachings herein.

Referring now to FIG. 11, an underlayer 231 is deposited over the structure. The underlayer 231 in this particular embodiment comprises a sub-layer of TiN 235 over which has been deposited an oxide hard mask sub-layer 233.

Figure 12:
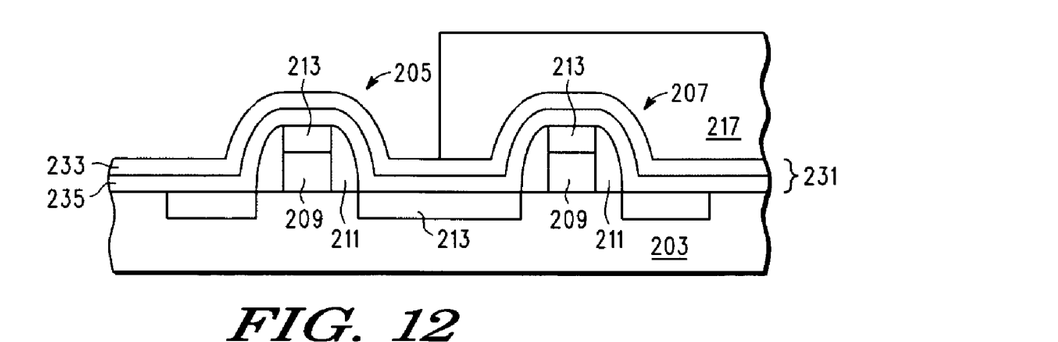
FIG. 12 illustrates a step in a process for making a dual stressor structure in accordance with the teachings herein.
Figure 13:
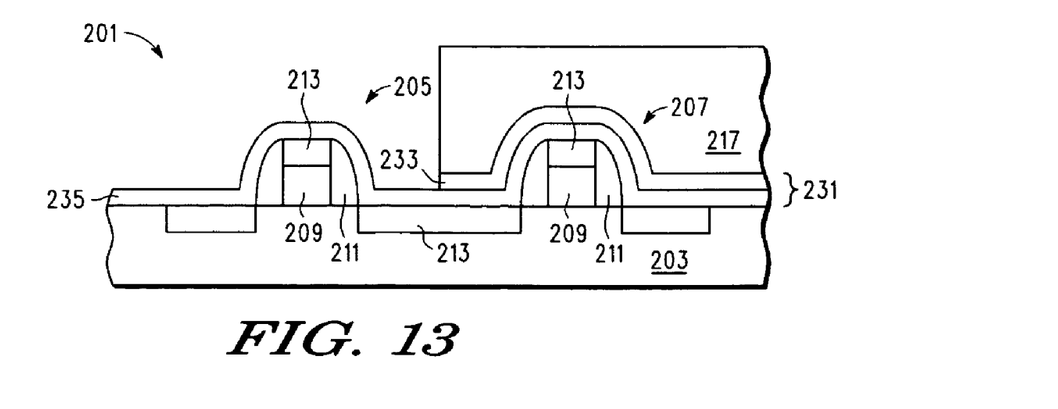
FIG. 13 illustrates a step in a process for making a dual stressor structure in accordance with the teachings herein.
Figure 14:
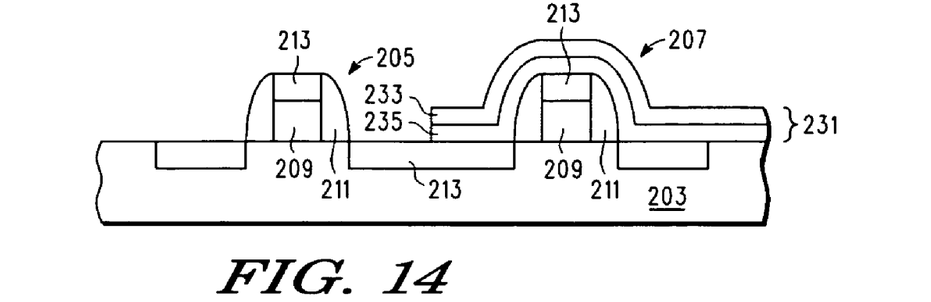
FIG. 14 illustrates a step in a process for making a dual stressor structure in accordance with the teachings herein.

With reference to FIG. 12, a first layer of photoresist 217 is then deposited over the structure, and is patterned such that the region of the structure containing the first gate structure 205 is exposed, while the region of the structure containing the second gate structure 207 is masked. The oxide hard mask sub-layer 233 is then removed from the exposed portion of the device with a suitable etch, as shown in FIG. 13. Preferably, this etch is an aqueous HF etch. Subsequently, as shown in FIG. 14, the first layer of photoresist 217 is removed, preferably through oxygen ashing. The exposed portion of the TiN sub-layer 235 is also removed with a suitably etchant, preferably Pir/SC1 (Pir, or "Piranha", also known as SPM (Sulfuric Peroxide Mixture), is a mixture of $H_2SO_4$ and $H_2O_2$; SC1, or "Standard Clean 1", is a mixture of $NH_4OH$ and $H_2O_2$).

Figure 15:
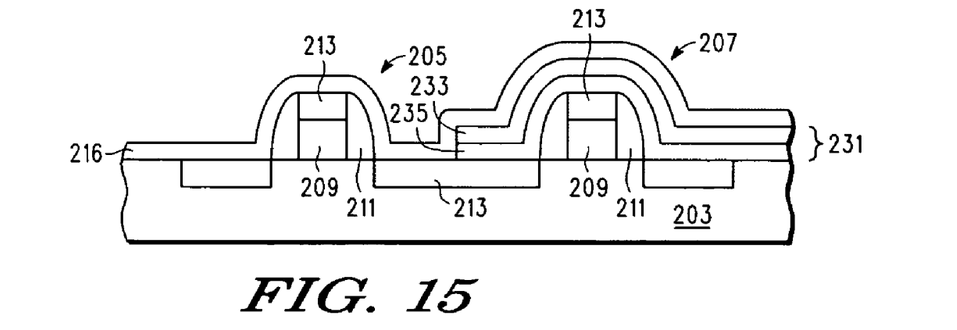
FIG. 15 illustrates a step in a process for making a dual stressor structure in accordance with the teachings herein.
Figure 16:
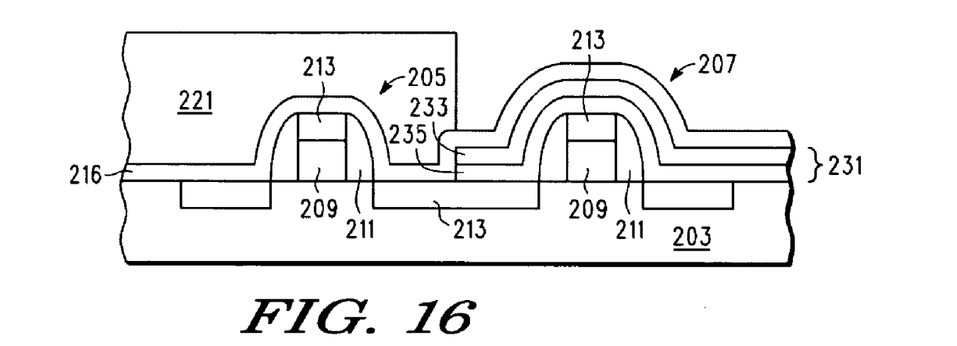
FIG. 16 illustrates a step in a process for making a dual stressor structure in accordance with the teachings herein.

Referring now to FIG. 15, a compressive stressor layer 216 is deposited over the structure. The compressive stressor layer 216 is preferably deposited as a conformal layer. A second layer of photoresist 221 is then deposited over the structure as shown in FIG. 16. The second layer of photoresist 221 is patterned such that the region of the structure containing the second gate structure 207 is exposed, while the region of the structure containing the first gate structure 205 is masked.

Figure 17:
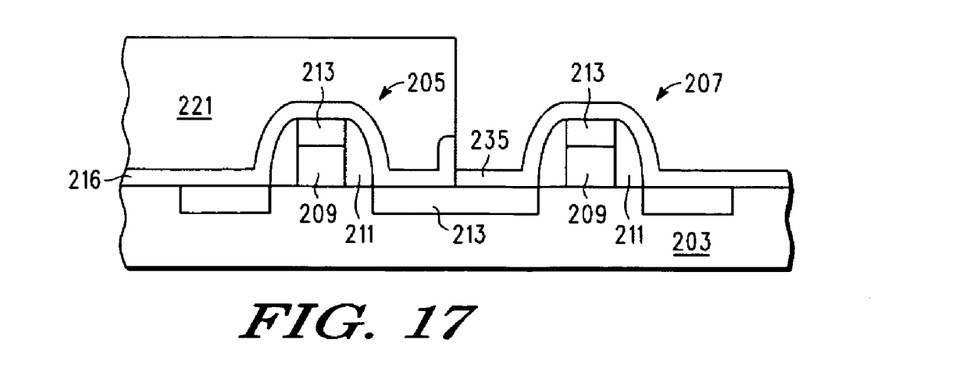
FIG. 17 illustrates a step in a process for making a dual stressor structure in accordance with the teachings herein.

As shown in FIG. 17, the exposed portion of the compressive stressor layer 216 is then removed with a suitable etch. Preferably, a suitable dry etch is used to remove the bulk of the compressive stressor layer 216. The underlayer 231 (and in particular, the oxide hard mask sub-layer 233 thereof) is used as an etch stop during the dry etch. Hence, the dry etch used here preferably has high selectivity to the oxide hard mask sub-layer 233. The residual portion of the compressive stressor layer 216 (which will typically be present in areas adjacent to the gate structure 207) is removed with an isotropic aqueous HF etch. The isotropic aqueous HF etch preferably also removes the oxide hard mask sub-layer 233.

Figure 18:
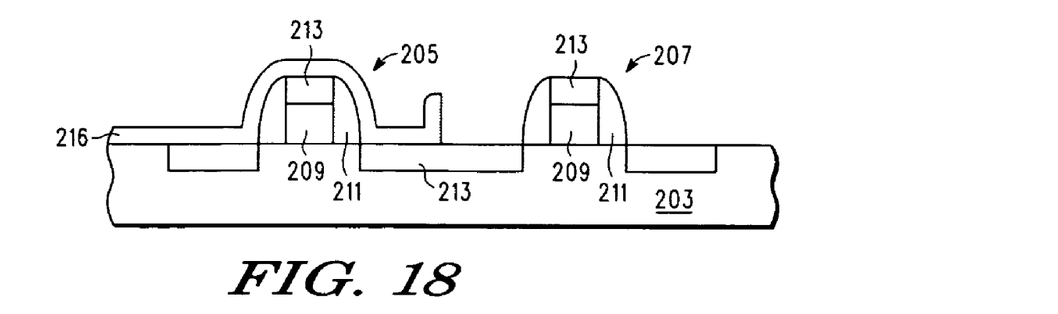
FIG. 18 illustrates a step in a process for making a dual stressor structure in accordance with the teachings herein.

As shown in FIG. 18, the second layer of photoresist 221 is then stripped with oxygen ashing, and the remaining portion of the TiN sub-layer 235 is then removed with Pir/SC1. However, it will be appreciated that, in other embodiments, a suitable etch may be used to remove the entire exposed portion of the underlayer 231 (including both the oxide hard mask sub-layer 233 and the TiN sub-layer 235) prior to removal of the second layer of photoresist 221. The etch used for this purpose is preferably selective to the metal silicide 213 and the spacer structures 211. In some embodiments, this etch may comprise multiple etches, and each of the multiple etches may have a unique chemistry.

Figure 19:
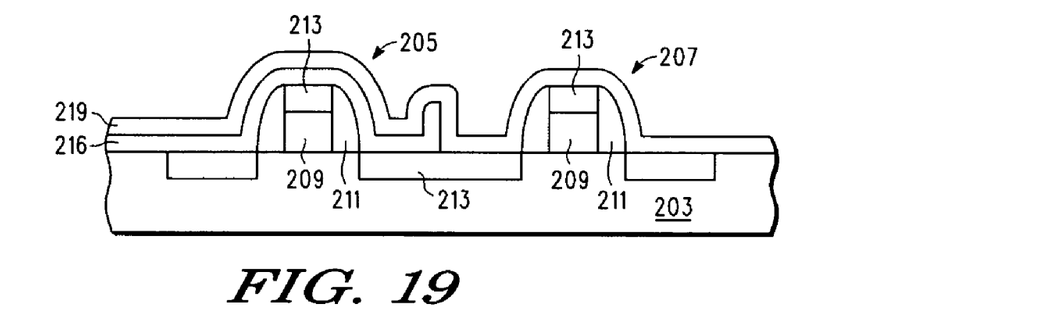
FIG. 19 illustrates a step in a process for making a dual stressor structure in accordance with the teachings herein.

Referring now to FIG. 19, a tensile stressor layer 219 is then deposited over the structure. The tensile stressor layer 219 is preferably deposited as a conformal layer.

Figure 20:
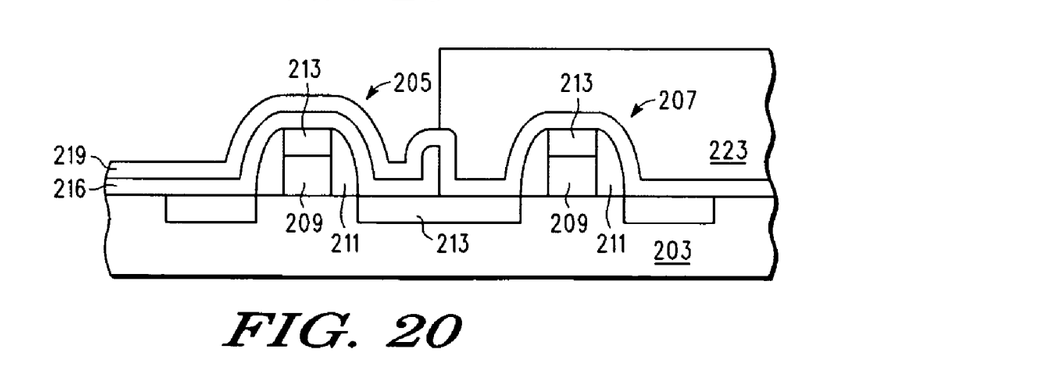
FIG. 20 illustrates a step in a process for making a dual stressor structure in accordance with the teachings herein.
Figure 21:
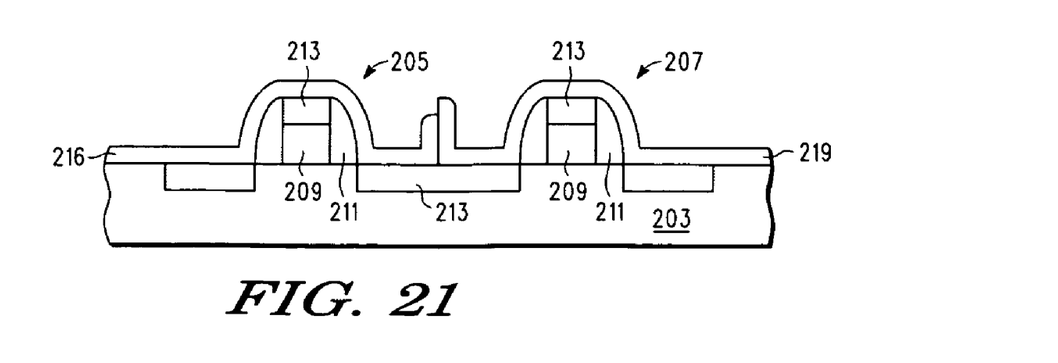
FIG. 21 illustrates a step in a process for making a dual stressor structure in accordance with the teachings herein.

As shown in FIG. 20, a third layer of photoresist 223 is then deposited over the structure and is patterned such that the region of the structure containing the second gate structure 207 is masked, and the region of the structure containing the first gate structure 205 is exposed. The tensile stressor layer 219 is then removed from the exposed region with a suitable etch. Preferably, a suitable dry etch is used to remove the bulk of the tensile stressor layer 219, and the residual portion of that layer (which will typically be present in areas adjacent to the gate structure 205) is removed with an isotropic aqueous HF etch. The compressive stressor layer 216 is used as an etch stop in this process. The third layer of photoresist 223 is then stripped, thus yielding the structure shown in FIG. 21.

A number of variations and modifications are possible to the process depicted in FIGS. 10-21 beyond those already noted. For example, rather than depositing the compressive layer first, the tensile layer could be deposited first. This could be achieved, for example, by modifying the procedure depicted in FIGS. 10-21 such that layer 216 is the tensile stressor layer and layer 219 is the compressive stressor layer, and such that the first 205 and second 207 gate structures correspond, respectively, to the NMOS and PMOS regions of the CMOS transistor. In such embodiments, suitable changes may be made to the etch chemistries.

The process depicted in FIGS. 10-21 has a number of advantages over the prior art process depicted in FIGS. 1-9. In particular, as previously noted, the wet etch used in the prior art process of FIGS. 1-9 can result in gouging of the metal silicide layer 213, and consequent degradation of the electrical properties of the device. By contrast, in the process depicted in FIGS. 10-21, a dry etch followed by a wet etch is utilized to ensure complete removal of the unneeded portions of compressive stressor layer 216 (see FIG. 16), and the metal silicide layer is protected from gouging during this etching through the presence of the hard mask sub-layer 233 and the underlying TiN sub-layer 235. The hard mask sub-layer 233, and the underlying TiN sub-layer 235, may be subsequently removed with an etch which has a high selectivity to the metal silicide 213, which again prevents gouging of the metal silicide 213.

A wet or dry etch, or preferably a combination of the two, may also be utilized to remove the unneeded portions of tensile stressor layer 219 (see FIG. 20). During this etch, which is preferably selective to the material of the compressive stressor layer 216, the compressive stressor layer 216 prevents gouging of the metal silicide 213.

In some embodiments of the foregoing methodology, a very thin oxide film may be deposited after the deposition of the compressive stressor film 216. This thin oxide film may act as an etch stop layer in the event of dry etch removal of the tensile stressor layer 219 from the PMOS regions of the device. The inclusion of this thin oxide film may also involve a prior additional breakthrough step in the etching of the compressive stressor layer 216 from the NMOS regions of the device.

The materials used in the stressor layers in the methods and devices described herein may comprise refractory insulating materials, or materials with appropriate etch selectivity and appropriate physical properties. Such films may comprise, for example, silicon nitride (e.g., $Si_3N_4$ or $Si_xN_y$) and/or silicon oxynitride (e.g., $Si_xON_y$). These materials may be grown or blanket deposited through suitable processes, such as chemical vapor deposition (CVD), plasma enhanced chemical vapor deposition (PECVD) or physical vapor deposition (PVD). Such films can be made with a well controlled thickness.

The thicknesses of the individual layers utilized in the structures and methodologies described herein may also vary. Typically, the stressor layers have a thickness within the range of about 400 Å to about 1200 Å, preferably within the range of about 600 Å to about 1000 Å, more preferably within the range of about 700 Å to about 900 Å, and most preferably within the range of about 750 Å to about 850 Å. The individual layers of the sacrificial underlayer will typically have thicknesses that are about a tenth of the foregoing thicknesses recited for the stressor layers.

The physical properties of the stressor films described herein, including the type and magnitude of the stress that these films apply, may be selected through appropriate manipulation of the process parameters used to form the film. Such parameters include, for example, deposition pressure, plasma power, process chemistry, and the spacing between the wafer and the electrode. By way of example, a tensile film exhibiting a tensile stress of approximately greater than 1000 MPa may be achieved using the following CVD parameters: a temperature of approximately 350-500° C., a pressure of approximately 1-10 Torr, a spacing between the wafer and the electrode of 1.0-1.3 cm, a combination of process gases such as silane and ammonia and inert gases such as nitrogen, helium, and argon, and a total RF power density in a range of approximately 0.05-0.32 watts per square centimeter ($W/cm^2$). Similarly, a compressive film exhibiting a compressive stress whose magnitude is approximately greater than −2000 MPa may be achieved with the following CVD parameters: a temperature of approximately 350-500° C., a pressure of approximately 1-10 Torr, a spacing between the wafer and the electrode of 0.05-1.1 cm, a combination of process gases such as silane and ammonia and inert gases such as nitrogen, helium, and argon, and a total RF power density in a range of approximately 0.05-0.8 $W/cm^2$.

While the particular embodiment of the process described in FIGS. 10-31 herein utilizes a sacrificial underlayer film which preferably comprises a layer of TiN over which has been deposited an oxide hard mask, it will be appreciated that other types of underlayer films may also be used in the structures and methodologies described herein. For example, the sacrificial underlayer may comprise an oxide film, below which a high k dielectric material, such as $HfO_2$, is used instead of a TiN film. A suitable etch chemistry (such as, for example, hot HCl) may then be used to strip the $HfO_2$. $HfO_2$ is suitable as an etch stop for removal of the overlying oxide film in dilute HF. More generally, however, any two materials which have sufficient etch selectivities with respect to different etch chemistries may be used as sacrificial underlayers in the structures and methodologies described herein. It will also be appreciated that the sacrificial underlayers described herein may, in some embodiments, have more than two layers, and may have more than two distinct materials.

Various wet and dry etches may be used in the processes described herein to remove the remaining portion of the tensile stressor layer 219 from the PMOS region of the device (these etches may also be used in the processes described herein to remove the remaining portion of the tensile stressor layer 219 from the PMOS region of the device in embodiments in which the compressive stressor film is deposited first). Dry etching of the ESL films can be accomplished by using standard etch techniques using halogen containing gases, either alone or combined with other gases, which could include carrier gases. The choice of gases is dependent on the type of selectivities required. Possible etchant gases may include, but are not limited to, $CF_4$, $CHF_3$, $CH_3F$, $SF_6$, $NF_3$, $CH_2F_2$, $C_4F_8$, $C_4F_6$, CO, $N_2$, $O_2$, He, and Ar. Suitable wet etchants include, but are not limited to, dilute, aqueous solutions of HF, with HF: $H_2O$ concentrations of approximately 1:50 to 1:1000.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, the method comprising:
    providing a substrate having a first gate structure and a second gate structure thereon;
    forming an underlayer over the first gate structure and the second gate structure;
    removing the underlayer from the first gate structure;
    forming a first stressor layer over the first gate structure and the second gate structure wherein the first stressor layer is in contact with the first gate structure and in contact with the underlayer over the second gate structure;
    removing the first stressor layer from the second gate structure with a first etch that uses the underlayer as an etch stop layer;
    removing the underlayer from the second gate structure;
    forming a second stressor layer in contact with the first stressor layer over the first gate structure and in contact with the second gate structure;
    wherein the underlayer comprises a first sub-layer of a first material and a second sub-layer of a second material, wherein the first material and the second material are distinct materials.

2. The method of claim 1, wherein the underlayer is removed from the first gate structure with a first underlayer etch and a second underlayer etch, distinct from the first underlayer etch.

3. The method of claim 2, wherein the first underlayer etch removes the first sub-layer and is selective to the second sub-layer.

4. The method of claim 3, wherein the second underlayer etch removes the second sub-layer and is selective to the substrate.

5. The method of claim 4, wherein the first sub-layer is an oxide layer, wherein the second sub-layer is a TiN layer, and wherein the second sub-layer is disposed between the first sub-layer and the substrate.

6. The method of claim 5, wherein the first underlayer etch uses an aqueous solution of HF.

7. The method of claim 5, wherein the second underlayer etch uses a mixture selected from the group consisting of a mixture of $H_2SO_4$ and $H_2O_2$ and a mixture of $NH_4OH$ and $H_2O_2$.

8. The method of claim 4, wherein the first sub-layer is an oxide layer, wherein the second sub-layer is a layer of $HfO_2$, and wherein the second sub-layer is disposed between the first sub-layer and the substrate.

9. The method of claim 1, wherein the first stressor layer is selectively removed from the second gate structure through the use of a photo mask that exposes the second gate structure and masks the first gate structure.

10. The method of claim 1, wherein the semiconductor device is a CMOS transistor, wherein one of the first gate structure and the second gate structure is in a PMOS region of the device, and wherein the other of the first gate structure and the second gate structure is in an NMOS region of the device.

11. The method of claim 1, further comprising:
    selectively removing the second stressor layer from the first gate structure.

12. The method of claim 11, wherein the second stressor layer is selectively removed from the first gate structure through the use of a photo mask which exposes the first gate structure and which masks the second gate structure.

13. The method of claim 1, wherein the first etch is an isotropic etch.

14. The method of claim 11, wherein the first stressor layer imparts compressive stress to the substrate, and wherein the second stressor layer imparts tensile stress to the substrate.

15. The method of claim 9, wherein the first stressor layer and the second stressor layer comprise silicon nitride.

16. The method of claim 1 wherein, after the first stressor layer is removed from the second gate structure, a portion of the first stressor layer is disposed over the first gate structure, and a portion of the underlayer, is disposed over the second gate structure.

17. A method for making a semiconductor device, the method comprising:
    forming a first gate structure and a second gate structure overlying a substrate, wherein the first gate structure is disposed in an NMOS region of the device, and wherein the second gate structure is disposed in a PMOS region of the device;
    forming an underlayer over the second gate structure;
    forming a first layer of stress inducing material in contact with the first gate structure in the NMOS region and the underlayer in the PMOS region;
    masking the device such that PMOS region is exposed and the NMOS region is masked; and
    removing the first layer of stress inducing material and the underlayer from the PMOS region;
    forming a second layer of stress inducing material in contact with the second gate structure in the PMOS region and in contact with the first layer of stress inducing material in the NMOS region.

18. The method of claim 1, wherein removing the underlayer from the first gate structure creates an exposed first gate structure, and wherein the first stressor layer is formed over the exposed first gate structure.

19. A method for making a semiconductor device, the method comprising:
- forming a first gate structure overlying a first region of a substrate and a second gate structure overlying a second region of the substrate;
- forming an underlayer overlying the first gate structure in the first region and overlying the second gate structure in the second region;
- removing the underlayer from the first region;
- forming a first stressor layer over the first region and the second region wherein the first stressor layer is in contact with the first gate structure in the first region and in contact with the underlayer in the second region;
- etching the first stressor layer selectively with respect to the underlayer from the second region;
- removing the underlayer from the second region; and
- forming a second stressor layer in contact with the first stressor layer in the first region and in contact with the second gate structure in the second region.

20. The method of claim 19, wherein the underlayer comprises a first sub-layer of a first material and a second sub-layer of a second material, wherein the first material and the second material are distinct materials.

* * * * *